United States Patent [19]

Sandstrom

[11] Patent Number: 5,495,279
[45] Date of Patent: Feb. 27, 1996

[54] METHOD AND APPARATUS FOR EXPOSURE OF SUBSTRATES

[75] Inventor: Torbjörn E. Sandstrom, Mölnlycke, Sweden

[73] Assignee: Micronic Laser Systems AB, Taby, Sweden

[21] Appl. No.: 27,507

[22] Filed: Mar. 5, 1993

[30] Foreign Application Priority Data

Mar. 5, 1992 [EP] European Pat. Off. ............. 92103778

[51] Int. Cl.⁶ .................................................. H04N 1/21
[52] U.S. Cl. ............................................................. 347/258
[58] Field of Search ............................ 346/108, 107 R, 346/160, 76 L, 1.1; 347/258, 259, 256, 244, 241, 134

[56] References Cited

U.S. PATENT DOCUMENTS

| | | | |
|---|---|---|---|
| 3,861,804 | 1/1975 | Lehmbech | 356/106 |
| 3,938,191 | 2/1976 | Jarmy | 360/102 |
| 4,464,030 | 8/1984 | Coale et al. | 346/108 |
| 4,727,381 | 2/1988 | Bille et al. | 346/108 |
| 5,027,132 | 6/1991 | Manns et al. | 346/108 |

*Primary Examiner*—Mark J. Reinhart
*Attorney, Agent, or Firm*—Keck, Mahin & Cate

[57] ABSTRACT

A method for exposure of patterns described in one or several databases containing geometrical descriptions of said patterns by means of writing with a focussed laser light onto substrates which are photosensitive at the wavelength of the laser light, comprising the steps of moving the substrate during the writing procedure in a first direction (y) relative to a fixed frame, continuously moving the optics focussing laser light on said photosensitive surface in a second direction (x) essentially perpendicular to the first direction, spreading the focussed laser light on the photosensitive surface in the first direction (y) for forming an extended focus area, and independently controlling the focussed laser light hitting more than 100 position increments spaced in the first direction (y) across the extended focus area.

36 Claims, 5 Drawing Sheets

METHOD AND APPARATUS FOR EXPOSURE OF SUBSTRATES

The invention relates to a method and apparatus for exposure of substrates and particularly the formation of patterns by laser-scanning lithography on large substrates such as printed circuit boards, artwork and masks for liquid crystal displays.

When making a mask, a pattern is exposed in photoresist on an opaque film of chromium on a glass substrate. In a develope-and-etch process the resist in the exposed areas is removed and the unprotected chromium is dissolved by a chromium etchant. The result, a glass plate with a pattern in opaque chromium, is used as an optical contact or projection mask for production of the conductor pattern on the glass plates of LCD display. The glass plates are coated with photoresist and exposed through the optical chromium mask. In this way highly complex patterns can be written on the mask and reproduced on the glass plates at an acceptable production cost in high volumes.

Large-area or "flat-panel" LCD displays have two unusual characteristics: there is a demand for large sizes, at present 450×450 mm, in the future larger than 1000×1000 mm, and high dimensional accuracy is needed. For so-called active matrix display with an active transistor in each image element, the complexity and the required accurcy is very high. Elements down to a size of 5 microns must be written and the maximum permissible geometrical errors are of the order 1 part per million i.e. 0,5 micron maximum error in a 500×500 mm plate.

A further appplication of the invention is for direct exposure, i.e. exposure directly on the glass plates used in the displays without the intermediate step of making a mask. This is mainly of interest for prototypes and low-volume products. The requirements are similar, but higher writing speed is needed.

Figure 1:
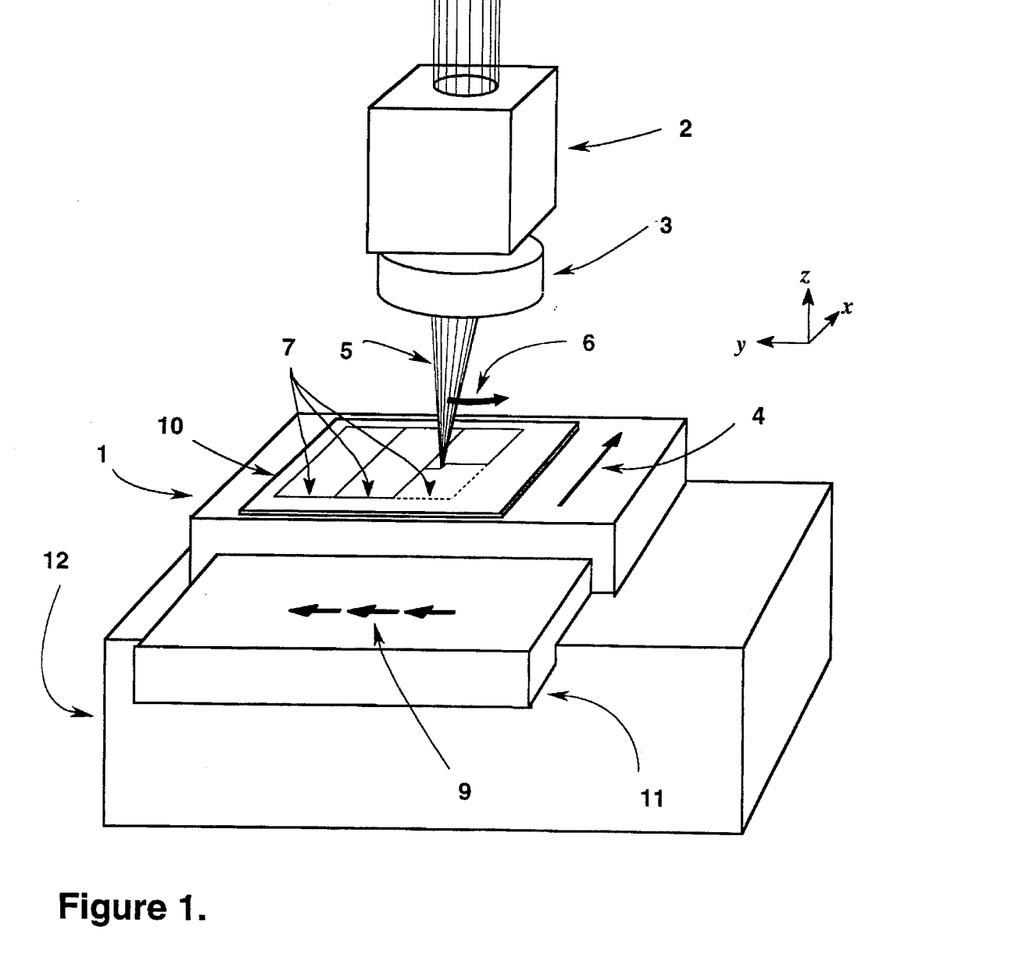
FIG. 1 shows a well-known apparatus.

Chromium masks of a smaller size, but with similar requirements on complexity and accuracy, are used by the semiconductor (IC) industry. These patterns are written by either scanning laser beams (U.S. Pat. No. 4,455,485), or by electron beams. The typical exposure tool which is shown by FIG. 1, has a stage 1 moving in the x and y directions under a fixed writing head 2, 3. The mowing range of the stage 1 is of the order of 150 by 150 mm. The position of the stage relative to the writing optics is measured by laser interferometers and corrected in real-time using servo motors. The pattern is written by so-called raster scanning, i.e. forming a regular grid of closely spaced pixels covering the entire surface. During the data preparation the geometrical shapes are converted to a pattern of intensity variation over the pixel grid. In the most common writing scheme, so-called write-on-the-fly, the stage 1 moves mechanically (mechanical motion 4) at a constant speed along x under the writing head. In the writing head there is a scanning (so- called sub-scanning) mechanism 2 that makes the beam 5 scan in the y direction 6, and a so-called stripe 7 is "painted" (on a substrate 10). Early laser scanners did not have the sub-scanning feature, but the speed requirements of today makes it necessary to form stripes 7, that are 250–5000 picels wide, for each mechanical stroke 4. When one stripe is finishe, the stage 1 retraces and moves by mechanical step-by-step movement 9 to the next stripe. Thus there is a fast continuous mechanical motion 4, a fast perpendicular sub-scanning 6 and a slow, usually stepping, mechanical movement 9 in the same direction as the sub-scanning.

Scaling a typical IC pattern generator up to the large size needed for flat panel masks results in a large and heavy machine. The position accuracy needed makes a solid stage design necessary; a non-flat stage or a stage that sags at the ends of the scanning stroke give unacceptable position errors. Furthermore, to attenuate mechanical vibrations and control the thermal expansion, materials of choice for the stage is massive granit and low-expansion ceramics.

As an example a writer for 600×600 mm plates 10 would have an xy-stage consisting of an x stage 1, an y stage 11, and a supporting frame 12, would occupy an area of 1200× 1400 mm. The slow movement 9 would be done by the y stage 11, a slab of granit measuring 1200×600×150 mm and weighing 250 kg. The fast mechanical movement is done by the x stage 1 which is 620×620×25 mm and weighs 25 kg. The substrate 10 alone can weigh up to 6 kg. The supporting structure 12, i.e. the large block of granit on which the y stage moves, would have to be dimensioned solid enough take up the inertial forces of the moving masses and the whole machine would weigh of the order of 2000 kg. The size of the machine is an important economic parameter not only during manufacture and transport, but also during operation since it has to be operated in a particle-free environment where the floor-space is expensive. Another problem with a straight-forward up-scaling is that the stage servos become slow due to the large masses that have to be moved.

The problem to be solved by the invention claim in patent claim 1 and patent claim 24 is to reduce the masses of the elements to be moved during generation of the pattern onto the substrate.

The invention consists of a method for exposure of patterns described in one or several databases containing geometrical descriptions of said pattern by means of focussing laser light onto substrates which are photosensitive at the wavelength of the laser light, comprising the steps of moving substrate during the writing procedure in a first direction (y) relative to a fixed frame, continuously moving the focussed laser light in a second direction (x) essentially perpendicular to the first direction, spreading the focussed laser light on the photosensitive surface in the first direction for forming an extended focus area, and independently controlling the focussed laser light hitting more than 100 position increments spaced in the first direction across the extended focus area. This control of the individual position increments may be performed by a data stream created from the geometrical data contained in the database.

Further, the invention consists of an apparatus for exposure of patterns, described in one or several databases containing geometrical data, by means of focussed laser light onto large substrates which are photosensitive to the wavelength of the laser light, comprising a fixed support frame; a stage carrying the substrate, said stage having a mechanical movement in a first direction on said fixed support frame; a guiding rail on said support frame; a carriage, carrying the final focussing optics, is sliding in a continuous movement in a second direction perpendicularly to the first direction on said guiding rail; one or several laser sources which may be mounted on the support frame together with means for launching laser beam energy towards the carriage in a direction parallel to the continuous movement of the carriage in the second direction; spreading means for spreading the focussed laser light over an extended focus area in the direction of the stage movement in the first direction; and controlling means for independently controlling the exposure at more than 100 position increments spaced in the first direction over the extended focus area.

These features guarantee a reduced size, weight and power consumption of the machine. Because of the reduced inertia of the moving parts the machine can operate at higher mechanical speeds than a comparable conventional system. Smaller moving masses also reduce all mechanical transients, thus making the operation quiter and the position feedback systems faster. A secondary benefit is that the design is modular. The stage and support frame are completely independent from the guiding rail and the carriage. Machines for different writing formats can be built with identical carriages and with identical guiding rails and control systems. A way to increase the writing speed is to put two writing heads and two rail modules on a single support frame. It is then possible either to use the two heads in parallel, or to move the stage at a continuous speed and let the two writing heads work alternatingly. In the latter case the laser power and the datahandling capacity of the electronics can be utilized 100% of the time with no interruptions for mechanical retraces, and the continuous movement reduces the inertial forces further.

There is shown a way of reducing the size and weight of a laser pattern generator for particularly large substrates. Furthermore the moving masses are reduced by an order of magnitude. While a conventionally design for a writing format of 600×600 is inpractically large, and would hardly be possible at all for the format 1000×1000 mm, the invention is readily scalable to large sizes.

According to a preferred embodiment, the carriage can slide on air bearings on the guiding rail and the carriage can be driven by a linear electric motor. According to a further improvement a simplification of the position feedback system for solving practical problems is obtained. In conventional systems laser interferometers measure the position of the stage relative to mirrors on the lens. The stage has long interferometer mirrors, flat to a fraction of a wavelength and extending over the movement range of the stage, i.e. typically 180 mm long for a 150×150 mm stage. The interferometer signals are compared to the desired positions by control electronics, and correcting signals are applied to the servo motors. There exists a number of problems when this scheme is applied to a large-area writer: the mirrors are difficult to manufacture, the control loops are slow due to the weight of the stage. A further improvement is obtained by measuring the lateral position of the stage relative to the focussing lens and applying corrections to the position of the focussed laser light during the writing procedure. The measurement can be done by laser interferometry.

According to the improvement, the position feedback is not applied to the stage, but to the position of the writing beam. Small displacements can be created by delaying the data relative to the scanning movements. Alternatingly, and more suitably in some implementations, the data can be modified to displace the pattern according to the error information from the interferometers.

Larger displacements are created by mechanical movement of the focussing lens. Moving the focussing lens is equivalent to moving the beam the same distance, everything else being constant. Of particular interest is to move the focussing lens by moving the ends of the guiding rail for correction of positioning errors.

A further explanation of the invention is given in connection with the attached drawing on which

Figure 2:
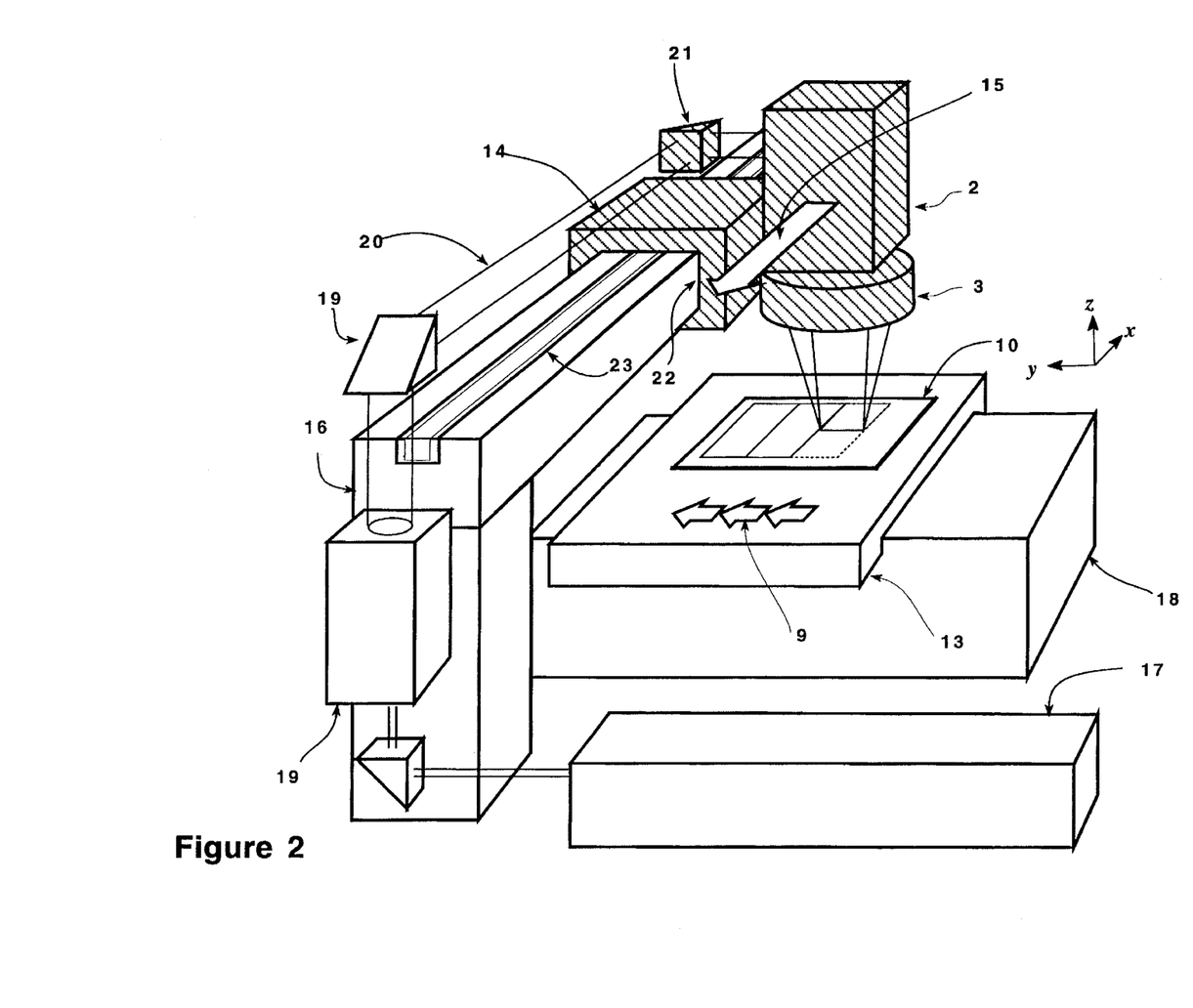
FIG. 2 shows an embodiment of the apparatus according to the invention.

FIG. 2 shows an embodiment of the invention. In this embodiment, a stage 13 on which the substrate 10 is placed moves in only one direction 9, the slow direction y. The writing head including an optical system 2 for generating stripes and focussing optics 3 is placed on a carriage 14 that slides in a continuous motion 15 along a guiding rail 15 along an essentially direction x. The parts moving with the carriage 14 are shown coloured in FIG. 2. The support at the far end of the rail is omitted for visibility. This is the fast mechanical movement and since the carriage 14 can be built much lighter and more compact than the stage top 1 (FIG. 1) of a conventionally designed system, the inertial energy can be reduced by an order of magnitude. The optical system 2 generates a stripe, i.e. typically several hundred pixels are written in the y direction for each x position along the guiding rail 16. The light beam is generated by a laser 17 mounted on a fixed frame 18 and a laser beam 20 is expanded, collimated and launched by an optical system 19 in a direction parallel to the guiding rail 16, so that it hits pick-up optics 21 of the carriage 14, with unchanging lateral position, angle and cross-section during the movement along the rail.

Figure 3A:
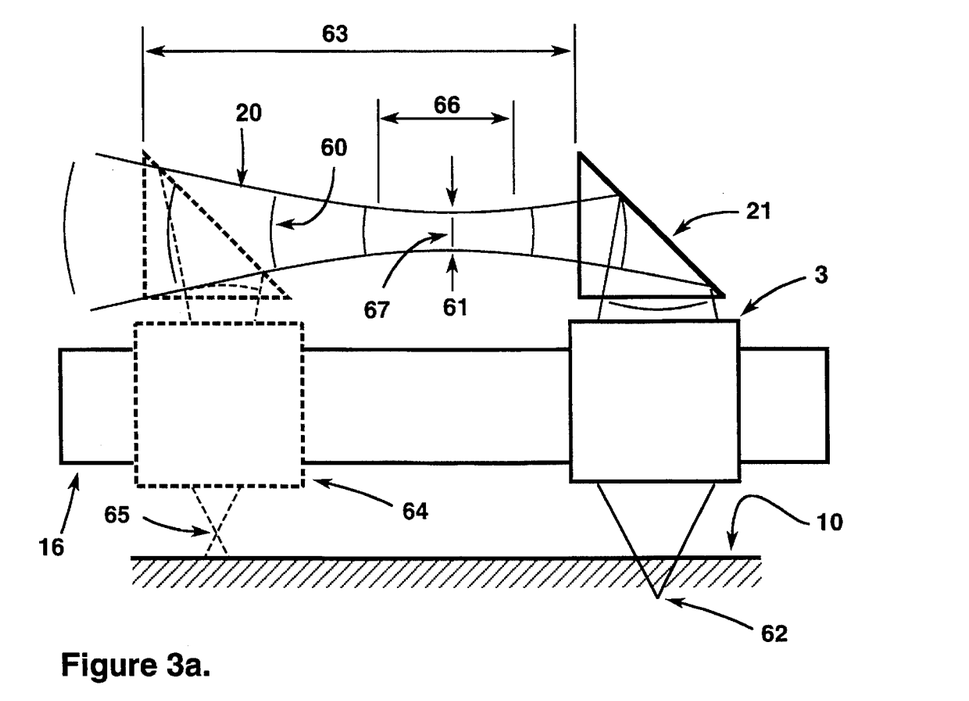
FIG. 3a and 3b show a part of the embodiment in FIG. 2 in detail.
Figure 3B:
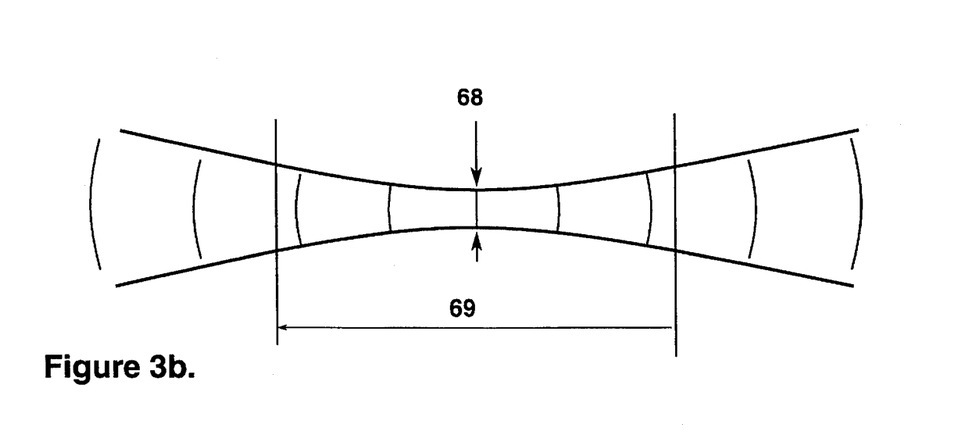

FIGS. 3a and 3b explain the expanding of the beam before launching it towards the carriage 14. A laser beam 20 of good quality has a Gaussian waist 61 where the diameter of the beam is at a minimum. At the waist 61 the wavefront 67 of the beam is flat, but moving a way from the waist 61 one finds that the wavefront 60 curves. This is equivalent to an apparent source distance of infinity at the waist and at a finite distance away from the waist. The apparent source distance effects the true position of focus 62 after the focussing lens 3. When the carriage 14 with the final focussing lens 3, the stripe-forming optics 2 and the beam pick-up optics 21 mounted on it slides along the rail 16 the curvature of the wavefront changes, so that the true focus is below the surface of the substrate 10 at the far end 62 of the movement range and above it at the near end 65. The curvature variation is determined by the wavelength and the diameter at the waist 61, and with an unexpanded laser beam the useful range 66 is less than the mechanical stroke 63. With the wider waist 68 (FIG. 3b) produced after a beam expander the wavefront is everywhere flatter, the focus shift is smaller and the acceptable range 69 is larger than the mechanical stroke 63.

The necessary size of the beam depends on the mechanical stroke, the wavelength and the focal depth of the lens. At 442 nm wavelength, a stroke of 600 mm and a focal depth of ±2,5 μm a suitable $1/e^2$ diameter is 3,5 mm. The $1/e^2$ diameter, a commonly used measure for laser beams is the diameter where the intensity is $1/e^2$ (=13,53%) of the intensity at the center of the beam.

A further improvement of the invention is a simplification of the position feedback system. According to the embodiment, shown in FIG. 4, the position feedback is not applied to the stage 13, but to the control of the position of the focussing lens 3. Moving the lens 3 is equivalent to moving the focussed laser beam 5 the same distance, everything else being constant. Of particular interest is to move the focussing lens 3 by moving the ends of the guiding rail 16.

Figure 4:
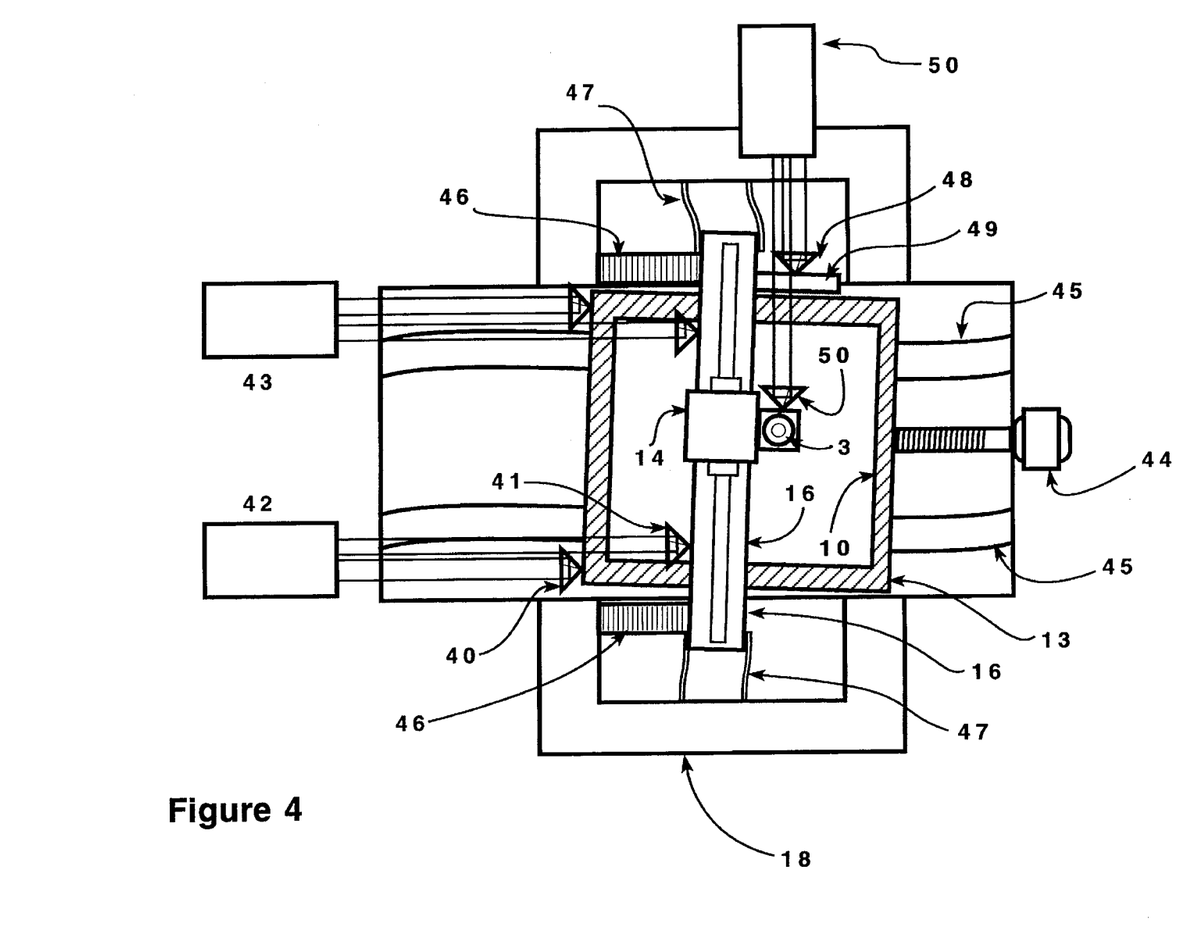
FIG. 4 shows another part of the embodiment in FIG. 2 in detail.

FIG. 4 shows in a top view of the machine how non-straight motion (exaggerated) and mechanical vibrations of the stage 13 are measured and compensated. The distance between a retroreflector 40 on the stage (the measurement arm of the interferometer) and another one 41 mounted on the guiding rail 16 (the reference arm) is measured by an interferometer 42. When the stage 13 is positioned for a new stripe a servo motor 44 is driven until the position error is within an acceptance range. The remaining position error and the angle error of the stage 13, due to the non-perfect guiding structures 45, are calculated from the readings of the two interferometers 42 and 43. The errors are compensated by two mechanism: a fast electronic servo and a slower mechanical one. Small errors are corrected by an electronic displacement of the written data relative to the stripe, either by a real-time modification of the data stream, or in the case of stripe formation through subscanning by delaying the data relative to the timing of the subscan. Larger errors are corrected by a mechanical displacement of the beam by a steering mirror before the final lens or by a mechanical displacement of the lens itself. Of particular interest is the mechanical servo system of FIG. 4. The position of the lens 3 is affected by a movement of the ends of the guiding rail 16. After the stage 13 has positioned itself approximately at the position for the next stripe, the rail 16 is moved to the exact location and turned to the exact angle by the two piezoelectric actuators 46 working against the force of the two stiff springs 47 mounted in the fixed frame 18. The actuators 46 are controlled by analogue voltages from a feed-back circuit 34 using the interferometer signals as input. After the feedback has settled on zero position error the guide is positioned at the correct position for next stripe 7, but vibrations and non-straightness in the rail 16 still needs to be compensated for. This is done by a combination of electronic displacements and movements by the actuators 46.

The accuracy of the system depends on two factors: first, the stiffness and lack of mechanical play in the air bearings 22 (FIG. 2), and secondly, that the rail 16 does not bend by any appreciable amount. Since there are no forces acting on the carriage 14 it follows any movements of the ends of the guiding rail 16 with a time constant essentially determined by the mechanical bending resonance of the rail 16 and the stiffness of the air bearings 22. With a properly designed rail 16 it is satisfactory to apply the position corrections to the ends of the rail 16, and the movement of final lens (focussing lens 3) will follow the ends of the rail 16 in an accurate way.

A long mirror in the y direction which is needed in conventional systems is replaced by a retroreflector 48 mounted on a ruler 49 that senses the edge of the stage 13. An air bearing 33 between the ruler 49 and the stage 13 makes the ruler 49 follow an average position of the edge without need to polish the edge to the surface finish of an interferometer mirror. As a reference mirror is a retroreflector 31 mounted on the assembly including the focussing optics 3. An interferometer 32 sends timing information to the writing optics included by the optical system 2 (FIG. 2), so that the data is written when the focussing lens 3 passes the correct position.

The benefit of this embodiment is again that smaller masses have to be moved by the control system. It also gives a simpler design without the long delicate mirrors and adds to the modularity of the invention, by putting the position feedback in the rail unit. The requirements on the slow stage are relaxed and makes it easy to modify the stage for special-purpose machines.

Figure 5A:
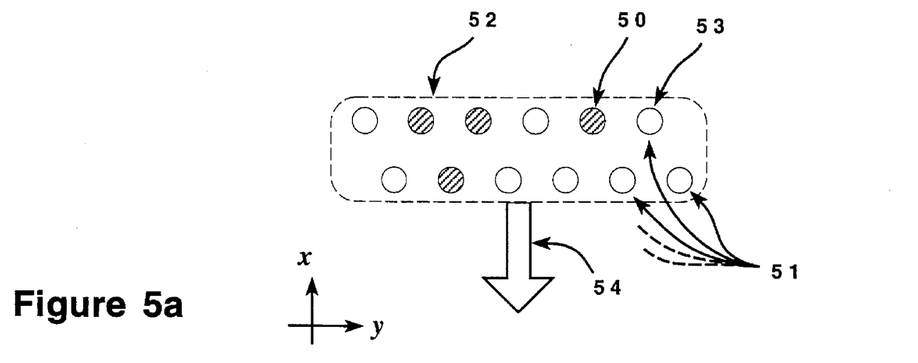
FIG. 5a, 5b, 5c show schematically the arrangement of spots-within of stripe of the pattern to be generated by the apparatus according to the invention.
Figure 5B:
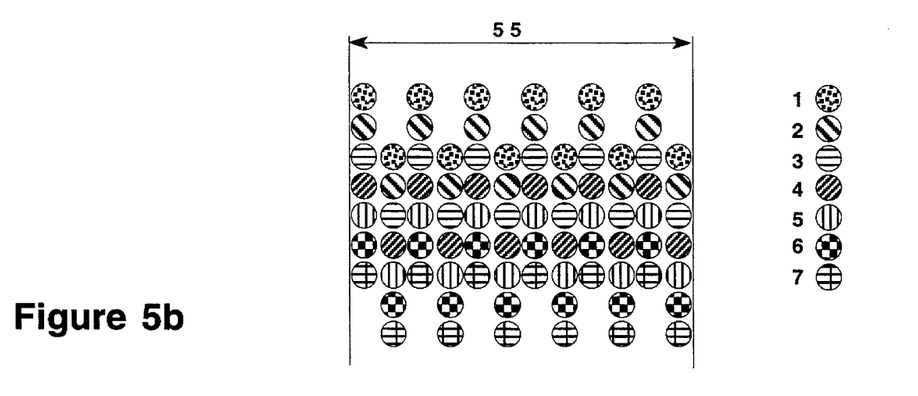
Figure 5C:
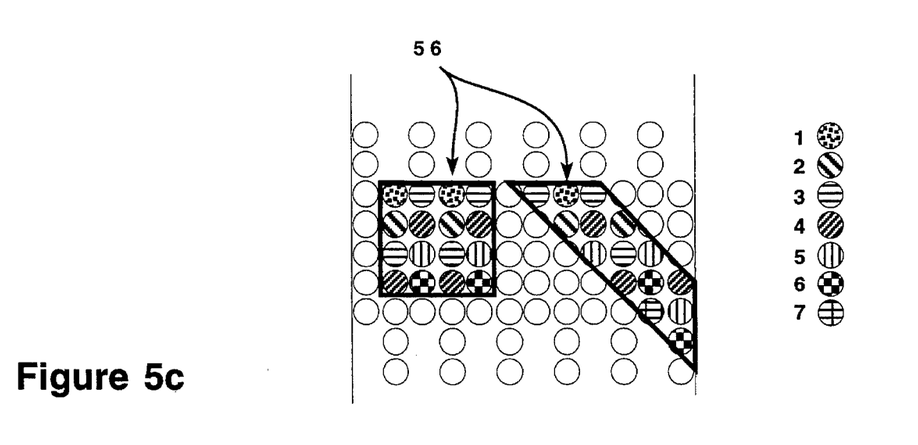

FIGS. 5a, 5b, 5c explain a method by which the stripes 7 are generated, whereas a stripe is at least 100 pixels wide. One element of the invention is a mechanical scheme that allows high mechanical speed with acceptable power consumption and smooth operation. The other element is the writing of a large number of pixels spaced across the fast mechanical axis for each position along the guiding rail 16. It is the combination of these elements that gives the desirable characteristics of small footprint, low power consumption, quiet operation and high writing speed.

FIGS. 5a, 5b, 5c show the basic requirements for the stripe generation: Instead of a single focus spot 50 the optics generates an array of spots 51 at the photosensitive surface, exposed simultaneously, in sequence or a combination of both thus forming an extended focus area 52. Different spots 50, 53 can be individually controlled. They can be distributed in a line, several lines or an array within the focus area 52, but they are spaced in the direction perpendicular to the direction of mechanical scan 54 caused by movement of the carriage 14 along arrow 15 in FIG. 2. FIG. 5b shows how the mechanical scanning of the array 54 in FIG. 5a forms a surface-filling pattern in a stripe 55 corresponding to one of the stripes 7 in FIG. 2 during the scanning. The FIG. 5b shows the pixels exposed at each of seven consecutive positions along the mechanical scanning direction 54. In FIG. 5c the focus spots are individually controlled to expose a pattern 56.

It is necessary to find a way to generate a stripe which does not generate vibrations and which is compatible with a moving low-mass carriage 14. One such vibration-free methods of stripe formation is acousto-optic subscanning, as disclosed in U.S. Pat. No. 4,455,485. The acousto-optic subscanning can be performed by the stripe generating optics 2 of the writing head. The beam makes a full acousto-optic scan along the y axis for each position along x and 250–1000 are exposed sequentially. The acousto-optical deflector is preferably placed on the carriage 14 within the optic 2 together with the final focussing optics 3 while the modulator may be a part of the optics 19 on the fixed support frame 18. Another appropriate writing optics is described in DE 40 22 732 A1.

Other methods for creating a stripe with compact non-moving components are discussed by David L. Hecht in "Multibeam Acoustooptic and Elektrooptic Modulators", Xerox Corporation, Palo Alto Research Center, pages 2 to 9. Several such methods can be designated by the generic term spatial light modulator (SLM). An SLM is a light valve with many elements operated in parallel. The light transmission of each element can be controlled independently from other elements Examples are arrays of LCD cells and the electrooptic device described in Reference 2. In the invention an SLM is illuminated by a laser beam and an image of the SLM is formed on the photosensitive surface. The SLM is preferably mounted on the carriage.

A preferred embodiment of the invention is a writer for patterns up to 600 by 600 mm. The supporting frame 18 is formed by a granit block and has the measures 600×1200× 150 mm. On it there is the stage 13 with the measures 620×620×25 mm, weighing 25 kg. Over the stage 13 there is the guiding rail 16. 700 mm long with a hollow 100×100 mm cross-section. The weight of the guide with supports is 10 kg and on it there is a 100 mm long carriage 14 weighing 2 kg including the optical components 2, 3, 21. The carriage slides on stiff air-bearings 22 along the rail 16. In a recess in the rail there is a linear motor 23 driving the carriage 14 along the rail 16.

Compared to a conventional design the preferred embodiments of the invention halves the floor-space requirement and reduces the moving masses by a factor of ten. In particular the fast scanning is done by the carriage weighing 2 kg compared to the stage top weighing 25 kg in the conventional design.

The stage 13 is driven by a stepping motor 44 through a ball-nut, so that the stage can be positioned at a large number of discrete, but not necessarily accurate, positions along its movement range 9. No fine-positioning exists on the stage, but instead its actual position is measured and compensated for by mechanical and electronic servos.

At each end support of the guiding rail 16 there is the piezoelectric actuator 46 displacing the rail 16 in the y direction. The actuators 46 are driven by analog voltages from a control system including the interferometers 42, 43 and the feedback circuit 34 sensing the position of the rail 16 relative to that of the stage 13 by interferometry. Together the two actuators 46 correct for the limited resolution in the stepping motor 44 and for non-straight travel of the stage 13. Each actuator 46 has the movement range 100 μm and works on a maximum inertial load of 7 kg and the response time is acceptable.

The carriage 14 slides smoothly on the air bearings 22 along the guiding rail 16. It is driven by the linear electric motor 23 and except for electric cables and air supply tubes there is no physical contact between the rail 16 and the carriage 14. The only forces acting on it are from the contact-less motor 23 and from inertia.

In order to compensate errors concerning the straightness of the guiding rail 16 a calibration is possible. After the machine is assembled one has to write a test plate and measure the writing errors. The errors are stored in a calibration file and fed to the control system as a compensation during subsequent writing. The same applies to the straightness of the edge of the stage 13 against which the ruler 49 slides.

The stripe 7 (FIG. 2) or 55 (FIG. 5b) is formed by acousto-optical scanning in the y direction by an acousto-optical deflector in the stripe generating optics 2 mounted immediately above the focussing lens 3. The pixels are 1×1 μm and each stripe is 512 μm wide. The lens is an NA=0,14 flatfield-corrected lens with 12 mm focal-length. The pixel rate is 40 million pixels per second, and the scanning frequency of the deflector is 50 kHz. The fine-positioning in the x direction is based on the timing of the start of each acousto-optical scan. The interferometer logic connected to the interferometer 32 issues a start-of-scan pulse when the focussing lens 3 is at the correct position. In the y direction the mechanical servos described above are supplemented by a data-delay feature which moves the data along the acousto-optical scan as described in DE 40 22 732 A1. This is equivalent to an inertia-free feed-forward control system raising the bandwidth of the position control to above 100 Hz.

Allowable angle deviations from stroke to stroke are only about 10 microradians, and there must not be any focus shift along the stroke. This is solved in the preferred embodiments in a number of ways. First, the carrier runs on air bearings preloaded to high stiffness, so that the position of the carriage 14 relative to the guiding rail 16 is well-defined and independent of external air pressure and temperature. A non-perfect guiding rail may give a writing error along the scan. However, this error can be measured during calibration, stored as a correction curve and fed to the position feed-back system for compensation during writing. To keep the focus constant one has to expand and collimate the laser beam 20 by beam-shaping optics 19 before it is launched. The beam is expanded to a $1/e^2$ diameter of at least 2,0, preferred of 3,5 mm and calculations show the focus error over a scan to be less than 0,5 μm.

A second practical problem is to make an auto-focus system that keeps the surface in focus during the stroke even on non-flat substrates. The useable focal depth is ±2,5 μm and the thickness of the substrate can vary by 100 μm. Active power focus systems are known in prior art, but used in the invention they would add weight and possibly vibrations to the carriage. Instead a passive autofocus by means of an air-cushion is used. The final lens is not fixed mounted in the carriage, but is free to slide up and down. Mounted at the lower end of the lens is the air-cushion, i.e. a flat surface under which compressed air is injected. The air flow between the lens and the substrate makes the lens float approximately 20 μm above the surface of the substrate. The height of the lens above the photosensitive surface is at all times constant and a perfect focus is maintained, even if the substrate is non-flat. The weight of the focussing lens is carried, not by the carriage, but by the substrate via the air-cushion under the lens.

This invention is not limited to the preferred embodiments. In particular the use of multiple elements such as multiple beams from a single laser, multiple lasers, multiple lenses on a single carriage, multiple rails with multiple carriages on a single stage etc. are obvious ways of modifying the invention without changing the principle of function.

I claim:

1. A method for exposure of very precise patterns by focused laser light onto a large substrate which is photosensitive at a wavelength of the laser light, comprising the steps of:

providing a database describing geometrical elements in a pattern, providing at least one laser light beam from at least one laser mounted on a fixed frame, spreading and focusing said at least one laser beam into at least 100 foci, distributed in a first direction (y) on a surface of a substrate, by means of a beam-spreading optical system and a focusing lens, mounting said beam-spreading optical system and said focusing lens on a movable carriage, modulating optical power reaching each focus in accordance with data in at least one database, moving the substrate stepwise in the first direction (y) relative to said fixed frame, continuously moving the carriage with the beam-spreading optical system and focusing lens relative to the fixed frame in a second direction (x) substantially perpendicular to said first direction (y), and collimating the laser beam propagated from the laser mounted on the fixed frame to the moving carriage essentially parallel to the second direction (x).

2. An apparatus for exposure of a pattern, described in at least one database containing geometrical data, by means of focussed laser light onto a substrate which is photosensitive to wavelength of the laser light comprising:

a fixed support frame (18);

a stage (13) carrying a substrate (10), said stage (13) being mechanically movable in a first direction (y) on said fixed support frame (18);

a guiding rail (16) fixed on said support frame (18);

a carriage (14) carrying focussing optics (3) for sliding in a continuous movement in a second direction (x) perpendicularly to the first direction (y) on said guiding rail (16);

at least one laser source (17) and means (19) for projecting a laser beam (20) towards to carriage (14) in a direction parallel to the second direction (x);

spreading means (2) for spreading focussed laser light over an extended focus area (52) in a direction of the stage movement which is in the direction (y); and controlling means for independently controlling exposure at more than 100 position increments spaced in the first direction over the extended focus area (52).

3. A method as set forth in claim 1, wherein a position of the substrate relative to the focusing lens is detected and corrections are applied by compensating in real time by movements of the foci relative to the fixed frame.

4. A method as set forth in claim 3, wherein detecting the position of the substrate is performed along at least one of the two directions (x, y) of movement.

5. A method as set forth in claim 4, wherein detecting the position of the substrate is performed by laser interferometry.

6. A method as set forth in claim 5, wherein measurement and reference arms of at least one interferometer are of equal length when the lens is near a center of the substrate.

7. A method as set forth in claim 1, wherein measurement along the second direction (x) is performed by laser interferometry against a mirror that is stationary in the first direction (y) and follows movement of the substrate in the second direction (x).

8. A method as set forth in claim 1, wherein data describing straightness errors of substrate movement and focussing lens movement are generated during calibration and used for correction during a writing procedure.

9. A method as set forth in claim 5, wherein timing of the writing at each position increments along the second direction (x) is synchronized to interferometer signals.

10. A method as set forth in claim 9, wherein the writing at the position increments is initiated by a synchronisation pulse generated by time interpolation of counting pulses derived from the interferometer signals.

11. A method as set forth in claim 1, wherein the focussing lens is moved along the second direction (x) by a guiding rail and the substrate is moved along the first direction (y) by means of a stage.

12. A method as set forth in claim 11, wherein a position of the stage relative to the guiding rail is measured by laser interferometry.

13. A method as set forth claim 12, wherein the position of the stage relative to the guiding rail is measured by laser interferometry at two positions along the guiding rail.

14. A method as set forth in claim 11, wherein position corrections are applied to controlling positions of end supports of the guiding rail.

15. A method as set forth in claim 14, wherein position of the guiding rail relative to the stage is measured near each end of the guiding rail and position of said each end is controlled by a feedback system.

16. A method as set forth in claim 14, wherein the position corrections are applied by means of piezoelectric actuators.

17. A method as set forth in claim 1, wherein position errors in the y-direction are corrected by a real-time electronic displacement of pattern data described in the at least one database.

18. A method as set forth in claim 8, wherein data describing shape errors of the guiding rail are generated during a calibration procedure and are used for correction during a writing procedure.

19. A method as set forth in claim 8, wherein auxiliary correction data, describing size and shape errors of the substrate and the exact position of the substrate on the stage, are used for correction during the writing procedure.

20. A method as set forth in claim 8, wherein the data are generated by analysis of the reflection of the laser light.

21. A method as set forth in claim 1, wherein the at least one laser beam is expanded to a $1/e^2$ diameter larger than 2.0 mm.

22. A method as set forth in claim 1, wherein an extended focus area is generated by acousto-optic deflection in a direction essentially parallel to the first movement direction (y).

23. A method as set forth in any of claim 1, wherein the extended focus area is generated as an image of a spatial light modulator illuminated by the laser beam.

24. An apparatus as set forth in claim 2, wherein the spreading means (2) is an acousto-optical deflector deflecting the laser beam in a direction essentially perpendicular to the second direction (x).

25. An apparatus according to claim 2, wherein air bearings (22) are disposed between the carriage (14) and the guiding rail (16).

26. An apparatus according to claim 2, wherein a linear electric motor (23) is provided for driving the carriage (14) along the guiding rail (16).

27. An apparatus as set forth in claim 2, further comprising a position feedback system consisting of measuring means (40, 41, 42, 43) for measuring lateral position of the stage (13) relative to position of the focussing optics (3) and controlling means for applying correction signals for controlling position of a written pattern relative to the support frame (18).

28. An apparatus as set forth in claim 27, wherein feedback correction signals are applied to correction means (46) at end supports of the guiding rail (16).

29. An apparatus as set forth in claim 28, wherein the correction means (46) are piezoelectric actuators.

30. An apparatus as set forth in claim 27, wherein at least two measuring means (42, 43) are provided at two positions along the guiding rail (16) for measuring the position of the stage (13) relative to the guiding rail (16).

31. An apparatus as set forth in claim 30 with at least one additional measuring means (48, 49, 50) for measuring the position of the stage (13) relative to the focussing optics (3) using one mirror on the carriage and another mirror sensing a position of an edge of the stage by means of an air bearing (33).

32. An apparatus as set forth in claim 2, wherein an air cushion is provided between a final lens and a surface of the substrate (10).

33. An apparatus as set forth in claim 2 comprising expanding optics (19) mounted on the support frame (18) for expanding the laser beam to a $1/e^2$ diameter larger than 2.0 mm.

34. An apparatus as set forth in claim 2, wherein the spreading means (2) are mounted on the carriage (14).

35. An apparatus as set forth in claim 2, wherein the spreading means (2) is an acousto-optical deflector deflecting the laser beam in a direction essentially perpendicular to the guiding rail (16).

36. An apparatus as set forth in claim 2, wherein the spreading means (2) is spatial light modulator and the extended focus area (52) is an image of the spatial light modulator.

* * * * *